(12) United States Patent
Wu et al.

(10) Patent No.: US 11,268,913 B2
(45) Date of Patent: Mar. 8, 2022

(54) METHOD AND APPARATUS FOR MONITORING EDGE BEVEL REMOVAL AREA IN SEMICONDUCTOR APPARATUS AND ELECTROPLATING SYSTEM

(71) Applicant: TAIWAN SEMICONDUCTOR MANUFACTURING COMPANY LTD., Hsinchu (TW)

(72) Inventors: Chao-Tung Wu, Taichung (TW); Kuo-Chung Yu, Tainan (TW); Chung-Hao Hu, Hsinchu (TW); Sheng-Ping Weng, Tainan (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 115 days.

(21) Appl. No.: 16/868,146

(22) Filed: May 6, 2020

(65) Prior Publication Data
US 2020/0264112 A1    Aug. 20, 2020

Related U.S. Application Data

(62) Division of application No. 14/713,409, filed on May 15, 2015, now Pat. No. 10,648,927.

(51) Int. Cl.
| | |
|---|---|
| *G01N 21/95* | (2006.01) |
| *H04N 7/18* | (2006.01) |
| *G06T 7/00* | (2017.01) |
| *C25D 17/00* | (2006.01) |
| *C25D 5/50* | (2006.01) |
| *H01L 21/67* | (2006.01) |

(52) U.S. Cl.
CPC ........... *G01N 21/9503* (2013.01); *C25D 5/50* (2013.01); *C25D 17/001* (2013.01); *G06T 7/0008* (2013.01); *H01L 21/67253* (2013.01); *H04N 7/188* (2013.01); *G06T 2207/30148* (2013.01)

(58) Field of Classification Search
CPC .................................................. G01N 21/9503
See application file for complete search history.

(56) References Cited

U.S. PATENT DOCUMENTS 5,857,826 A * 1/1999 Sato ................... H01L 21/67745
                                                    414/744.6
6,662,673 B1 * 12/2003 Olgado ............. H01L 21/67028
                                                    204/279

(Continued)

*Primary Examiner* — Harry D Wilkins, III
(74) *Attorney, Agent, or Firm* — WPAT, P.C., Intellectual Property Attorneys; Anthony King

(57) ABSTRACT

A method for inspecting a wafer includes: transferring the wafer from a transfer chamber to an annealing station by a robot arm; and monitoring at least one portion of an edge bevel removal area of the wafer over the robot arm when the wafer is transferred from the transfer chamber to the annealing station. The at least one portion of the edge bevel removal area includes a first portion and a second portion different from the first portion. When the wafer is passing through a predetermined location between the transfer chamber and the annealing station, a first charge-coupled device sensor located over the first portion of the edge bevel removal area is used to capture an image of the first portion, and a second charge-coupled device sensor located over the second portion of the edge bevel removal area is used to capture an image of the second portion.

20 Claims, 8 Drawing Sheets

(56) References Cited

U.S. PATENT DOCUMENTS

| | | | | |
|---|---|---|---|---|
| 6,707,544 B1* | 3/2004 | Hunter | ............... | G01N 21/956 |
| | | | | 356/237.5 |
| 7,130,036 B1* | 10/2006 | Kuhlmann | ............. | G01N 21/47 |
| | | | | 356/237.2 |
| 7,773,212 B1* | 8/2010 | Wolters | ............. | G01N 21/9501 |
| | | | | 356/237.4 |
| 2003/0030050 A1* | 2/2003 | Choi | ...................... | G03F 7/168 |
| | | | | 257/4 |
| 2004/0012775 A1* | 1/2004 | Kinney | ............. | G01N 21/9501 |
| | | | | 356/237.2 |
| 2004/0169869 A1* | 9/2004 | Shin | .................. | G01N 21/9505 |
| | | | | 356/635 |
| 2004/0185751 A1* | 9/2004 | Nakanishi | ............. | B24B 21/002 |
| | | | | 451/5 |
| 2004/0206375 A1* | 10/2004 | Ho | .......................... | B08B 3/02 |
| | | | | 134/26 |
| 2004/0207836 A1* | 10/2004 | Chhibber | ........... | G01N 21/9501 |
| | | | | 356/237.4 |
| 2008/0030731 A1* | 2/2008 | Jin | .................... | G01N 21/4738 |
| | | | | 356/369 |
| 2015/0001087 A1* | 1/2015 | Dinneen | ............... | C25D 21/10 |
| | | | | 205/81 |

\* cited by examiner

METHOD AND APPARATUS FOR MONITORING EDGE BEVEL REMOVAL AREA IN SEMICONDUCTOR APPARATUS AND ELECTROPLATING SYSTEM

PRIORITY CLAIM AND CROSS-REFERENCE

The present application is a divisional application of U.S. patent application Ser. No. 14/713,409 filed on May 15, 2015, which is incorporated herein by reference in its entirety.

BACKGROUND

During the fabrication process of a wafer, forming metal lines of the integrate circuits on the wafer is an important step in the process. The metal lines may be formed by an electroplating process or a physical vapor deposition (PVD) process. To increase the integration density of a wafer, the useable area of the wafer is expanded to reach the very near edge of the wafer. As a result, metal lines are also formed on the very near edge of the wafer. However, unwanted residual metal on the wafer edge should be removed by a so-called Edge Bevel Removal (EBR) process. Since the edge bevel area is adjacent to the useable area, the EBR process is controlled to ensure that an etchant etches the edge bevel area without harming the useable area. After the EBR process, wafers are monitored to determine if any abnormal wafer edge occurs. Thus, the quality of fabricated wafers is affected by the precision of the monitoring process. Moreover, the monitoring process may also affect the speed of the fabrication process. It may thus be desirable to provide a reliable and accurate monitoring method to increase the yield rate of semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Like reference symbols in the various drawings indicate like elements.

DETAILED DESCRIPTION

Figure 1:
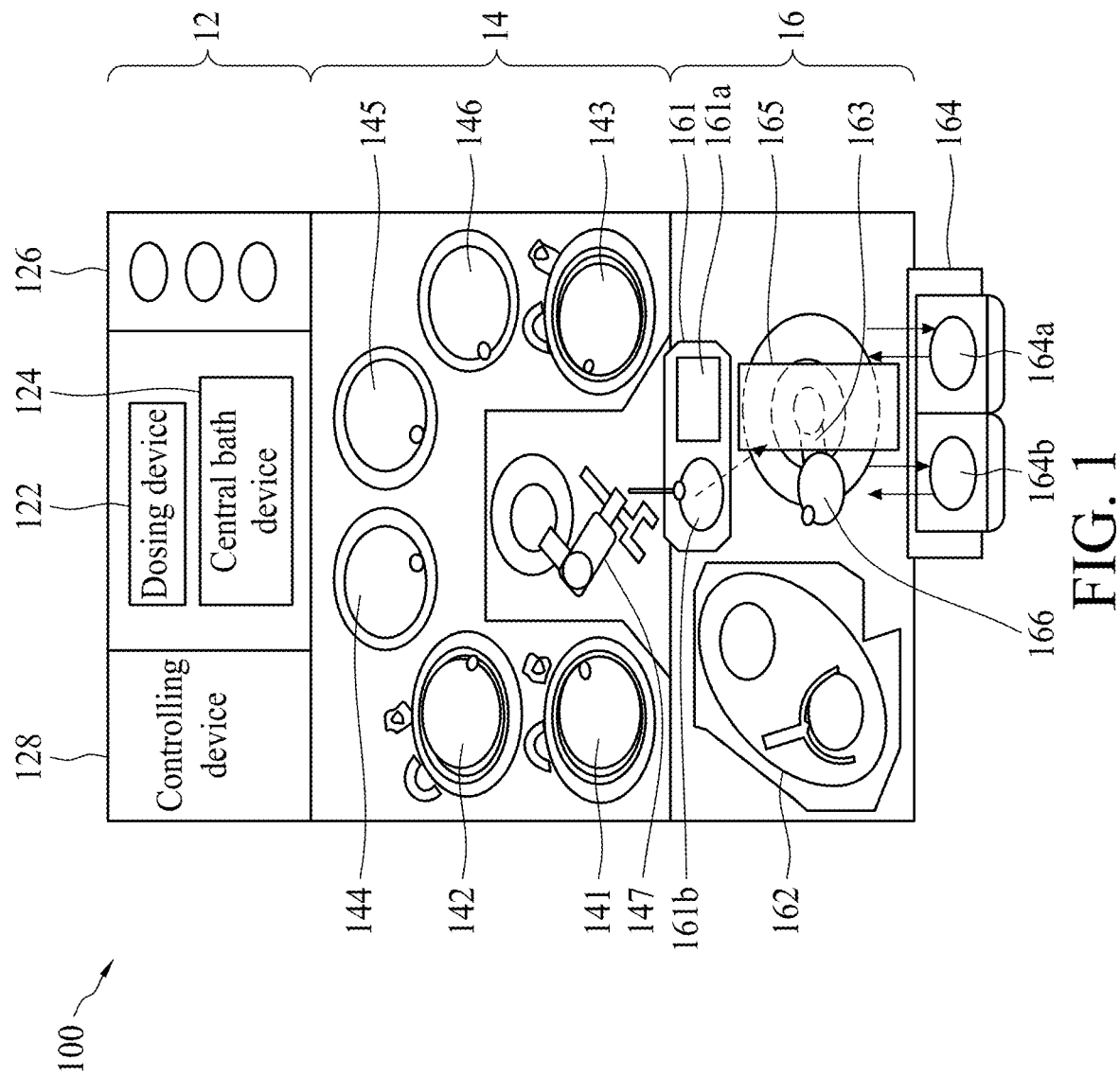
FIG. 1 is a diagram illustrating an electroplating system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Further, spatially relative terms, such as "beneath," "below," "lower," "above," "upper", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a diagram illustrating an electroplating system 100 in accordance with some embodiments. Referring to FIG. 1, the electroplating system 100 comprises a dosing apparatus 12, an electroplating apparatus 14, and a semiconductor apparatus 16. The dosing apparatus 102 comprises a dosing device 122, a central bath device 124, a filtration and pumping device 126, and a controlling device 128. The dosing device 122 is arranged to store and deliver chemical additives for the plating solution. The central bath device 124 is arranged to hold the chemical solution used as the electroplating bath in the electroplating apparatus 14. The filtration and pumping device 126 is arranged to filter the plating solution for the central bath device 124 and to pump the plating solution to the electroplating apparatus 14. The controlling device 128 is arranged to provide electronic and interface controls required to operate the electroplating system 100. The controlling device 128 may include a power supply for the electroplating system 100.

The electroplating apparatus 14 comprises a first electrofill module 141, a second electrofill module 142, a third electrofill module 143, a first post-electrofill module 144, a second post-electrofill module 145, a third post-electrofill module 146, and a robot arm 147. The first electrofill module 141, the second electrofill module 142, and the third electrofill module 143 are arranged to electrofill a metal (e.g. copper) on a wafer. A wafer is processed by either the first electrofill module 141, the second electrofill module 142, or the third electrofill module 143. After a wafer is processed, either the first post-electrofill module 144, the second post-electrofill module 145, or the third post-electrofill module 146 is arranged to perform a desired operation, such as an EBR process, backside etching, and acid cleaning, upon the wafer. In the electroplating apparatus 14, the robot arm 147 is arranged to deliver the wafer to either the first electrofill module 141, the second electrofill module 142, the third electrofill module 143, the first post-electrofill module 144, the second post-electrofill module 145, or the third post-electrofill module 146 in order to perform a corresponding operation.

The semiconductor apparatus 16 is a semiconductor front-end apparatus of the electroplating system 100. The semiconductor apparatus 16 may also be a factory interface (FI) of the electroplating system 100. The semiconductor apparatus 16 comprises a transfer chamber 161, an annealing station 162, a robot arm 163, and an edge detector 165. A wafer cassette 164 is also shown in FIG. 1. The robot arm 163 may be a so-called front-end robot arm. The transfer chamber 161 is configured to interface with the electroplating apparatus 14. The transfer chamber 161 comprises a transfer station 161a and an aligner 161b. The transfer station 161a is a station where the robot arm 147 and the robot arm 163 may pass wafers without going through the aligner 161b. The aligner 161b, however, may be arranged to align a wafer to the robot arm 147 in order to precision deliver the wafer to either the first electrofill module 141, the second electrofill module 142, or the third electrofill module 143 by the robot arm 147. Moreover, the aligner 161b may also be arranged to align a post-electrofill wafer to the robot arm 163 in order to precision deliver the post-electrofill wafer to the annealing station 162 by the robot arm 163.

The annealing station 162 is arranged to anneal a post-electrofill wafer. After a wafer is processed by the electroplating apparatus 14, the robot arm 163 is arranged to transfer the wafer, i.e. the post-electrofill wafer, from the transfer chamber 161 to the annealing station 162. After the annealing process, the robot arm 163 is arranged to transfer the annealed wafer to the wafer cassette 164 from the annealing station 162. The wafer cassette 164 is configured to be an interface between the semiconductor apparatus 16 and another semiconductor system external to the semiconductor apparatus 16. In the embodiments, the wafer cassette 164 comprises a first cassette 164a and a second cassette 164b.

The edge detector 165 is disposed over or on top of the robot arm 163 for the purpose of monitoring at least one portion of an edge bevel removal (EBR) area of a wafer, e.g. the wafer 166 as shown in FIG. 1, carried by the robot arm 163. The wafer 166 is the post-electrofill wafer. More specifically, after the EBR process, the robot arm 163 is controlled to transfer the wafer 166 to the annealing station 162 from the transfer chamber 161, and the edge detector 165 is controlled to monitor the at least one portion of the EBR area of the wafer 166 when the robot arm 163 is still carrying the wafer 166. According to the embodiment, the edge detector 165 is arranged to monitor the EBR area of the wafer 166 in real-time.

Figure 2:
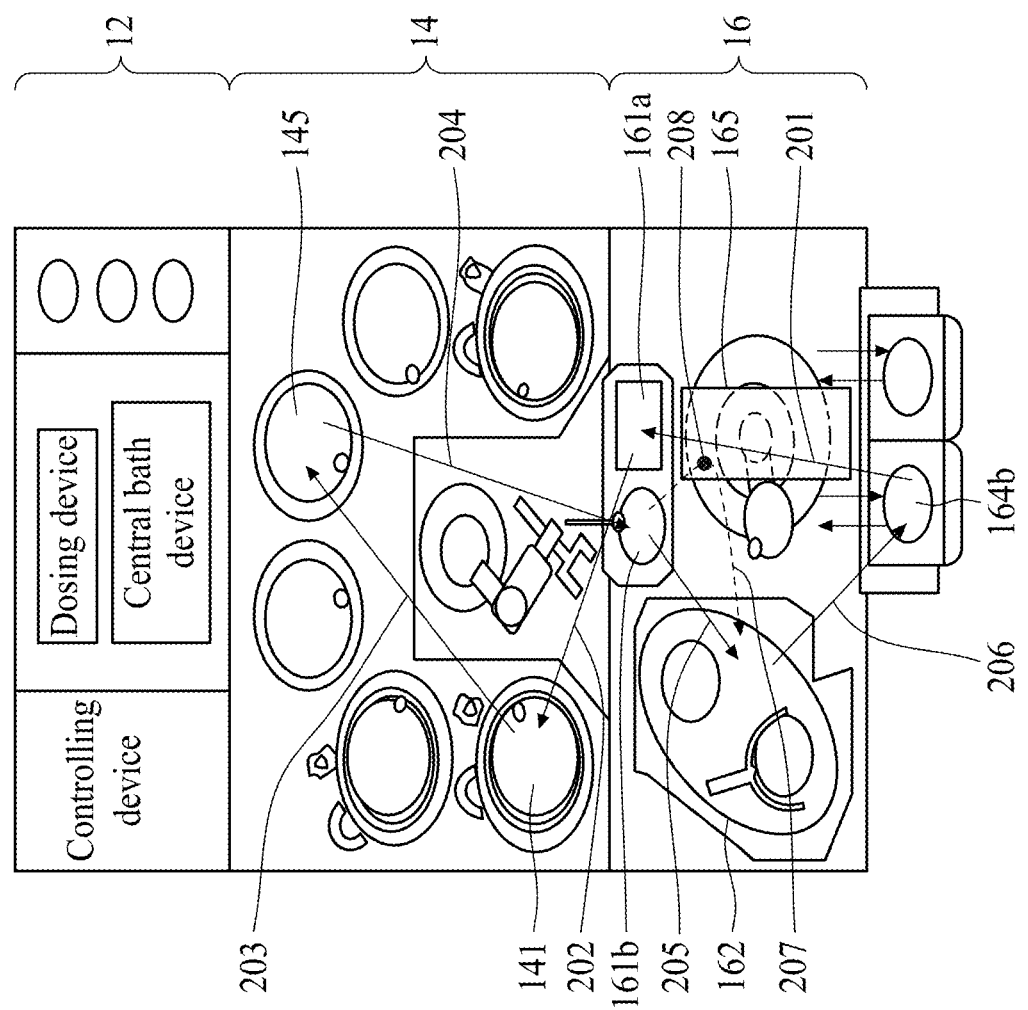
FIG. 2 is a diagram illustrating an electroplating system in which a processing flow of a wafer is included in accordance with some embodiments.

FIG. 2 is a diagram illustrating the electroplating system 100 in which a processing flow of a wafer is included in accordance with some embodiments. The processing flow is illustrated by a series of arrow symbols indicated by 201, 202, 203, 204, 205, and 206 respectively. When a wafer is loaded into one of the cassettes 164a and 164b in the wafer cassette 164, the robot arm 163 is arranged to deliver the wafer to the transfer station 161a of the transfer chamber 161, i.e. the arrow 201. The robot arm 163 may be configured to use a vacuum attachment technique to hold the wafer. It is noted that the robot arm 163 may also deliver the wafer to the aligner 161b if the wafer needs to be aligned with the robot arm 147.

According to the embodiments, the wafer is then delivered to the first electrofill module 141 by the robot arm 147, i.e. the arrow 202. It is noted that the wafer may be delivered to either the first electrofill module 141, the second electrofill module 142, or the third electrofill module 143. In the first electrofill module 141, the wafer may be electrofilled with a metal, such as copper. Electrolytes in the central bath device 124 may be used to perform the electrofill process.

After the electrofill process, the wafer is delivered to the second post-electrofill module 145 by the robot arm 147 in order to remove the unwanted copper layer on the edge bevel region of the wafer, as indicated by an arrow 203. The unwanted copper layer may be etched away by an etchant solution. The second post-electrofill module 145 may also clean, rinse, and/or dry the wafer. It is noted that the wafer may be delivered to either the first post-electrofill module 144, the second post-electrofill module 145, or the third post-electrofill module 146 in order to perform the EBR process.

When the EBR process completes, the wafer is delivered to the aligner 161b of in the transfer station 161a from the second post-electrofill module 145 by the robot arm 147, as indicated by an arrow 204. It is noted that the robot arm 147 may deliver the wafer to the transfer chamber 161.

According to the embodiments, the wafer (i.e. 166) in the aligner 161b is then delivered to the annealing station 162 by the robot arm 163, as indicated by an arrow 205. During the delivery of the wafer 166, the edge detector 165 captures an image of the at least one portion of the EBR area of the wafer 166 so as to monitor the wafer 166 in real time. More specifically, when the wafer 166 is positioned in the aligner 161b, the robot arm 163 stretches out to reach the aligner 161b. After holding the wafer 166, the robot arm 163 pulls back. Then, the robot arm 163 stretches out again to deliver the wafer 166 to the annealing station 162. As shown in FIG. 2, the dotted line arrow 207 is the transferring route of the wafer 166 delivered from the aligner 161b to the annealing station 162. The transferring route may be the predetermined route set by the manufacturer of the electroplating system 100. The wafer 166 will pass through a predetermined location 208 under or near the edge detector 165. When the wafer 166 reaches the predetermined location 208, the edge detector 165 is triggered to capture the image of the at least one portion of the EBR area of the wafer 166. It is noted that the predetermined location 208 can be any appropriate location between the robot arm 163 and the edge detector 165.

The image is directly sent to a processing device, either internal or external, to the electroplating system 100. The processing device is arranged to analyze the image for inspecting the EBR area of the wafer 166 in real time. Moreover, the edge detector 165 may be installed in anywhere above the robot arm 163 as long as the edge detector 165 can capture the image of the at least one portion of the EBR area of the wafer 166. It is noted that the edge detector 165 is not installed in the transfer chamber 161.

When the annealing process in the annealing station 162 completes, the robot arm 163 delivers the annealed wafer to one of the cassettes 164a and 164b, as indicated by a dotted arrow 206. The annealing station 162 may include a furnace. The annealed wafer in the wafer cassette 164 is then delivered to other systems, such as a chemical mechanical polishing system for further processing.

Figure 3:
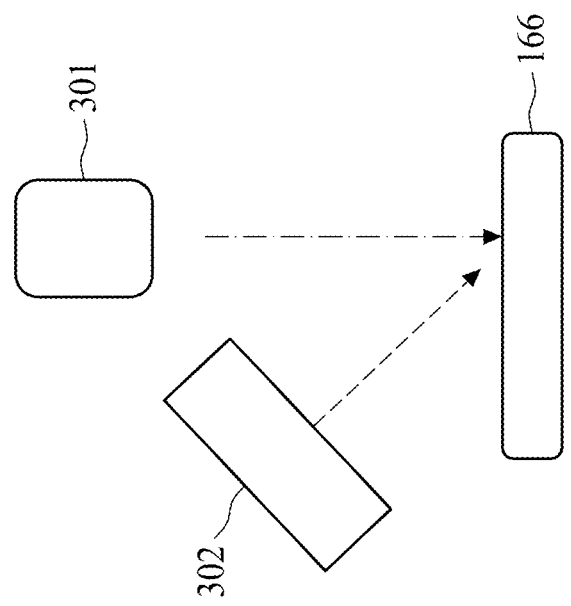
FIG. 3 is a simplified diagram illustrating a configuration of a charge-coupled device camera, an illuminant device, and a wafer in accordance with some embodiments.

According to the embodiments, the edge detector 165 comprises a charge-coupled device (CCD) camera 301 for capturing the image of the at least one portion of the EBR area of the wafer 166 by the charge-coupled technique. The edge detector 165 further comprises an illuminant device 302 for illuminating the at least one portion of the EBR area of the wafer 166. FIG. 3 is a simplified diagram illustrating a configuration of the CCD camera 301, the illuminant device 302, and the wafer 166 in accordance with some embodiments. The illuminant device 302 is controlled to illuminate the at least one portion of the EBR area of the wafer 166 with red light, for example, when the CCD camera 301 captures the image of the at least one portion of the EBR area of the wafer 166. The illuminant device 302 may output oblique light to the at least one portion of the EBR area as shown in FIG. 3.

Figure 4:
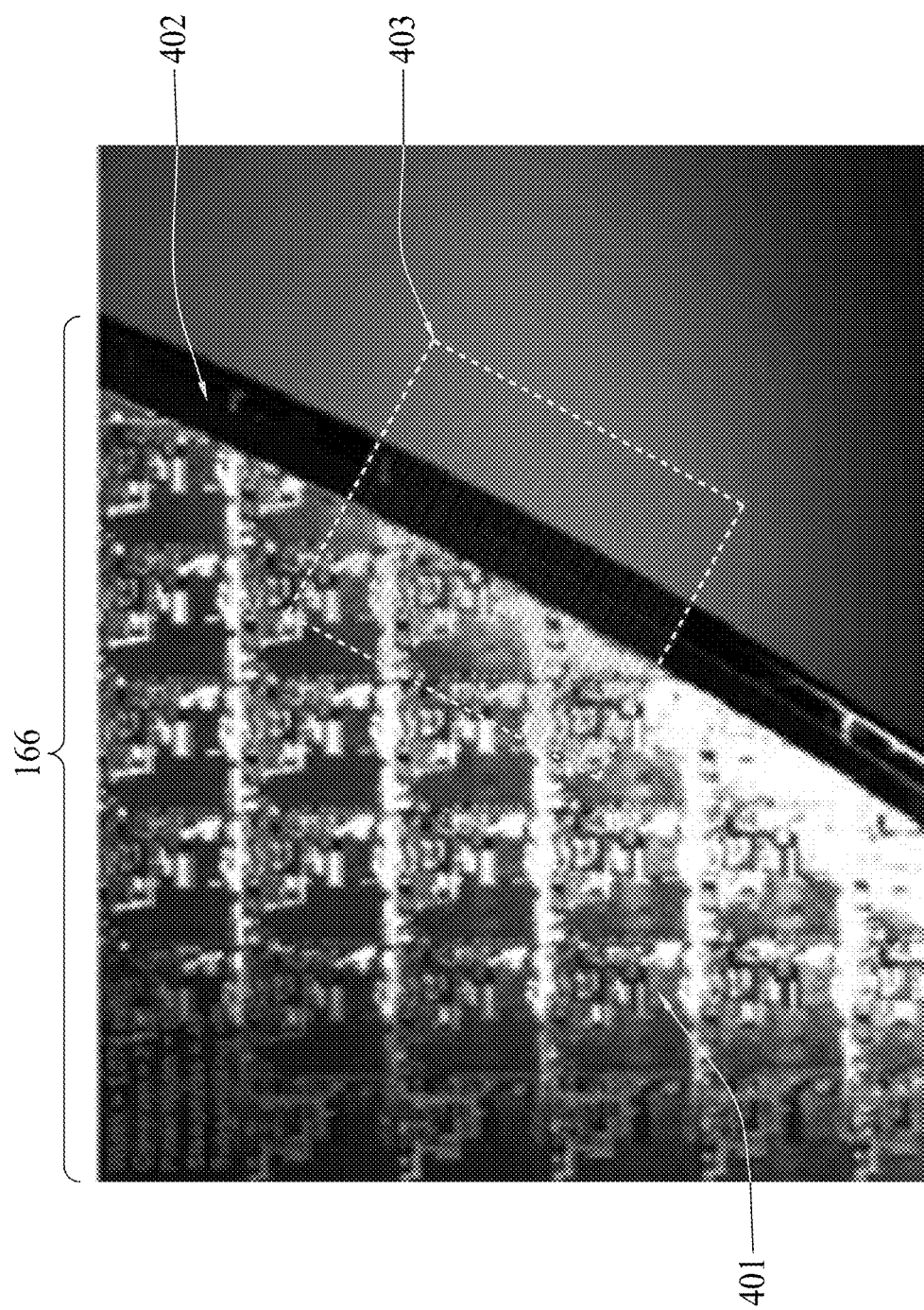
FIG. 4 is a real picture illustrating a portion of a wafer in accordance with some embodiments.

FIG. 4 is a real picture illustrating a portion of the wafer 166 in accordance with some embodiments. The portion of the wafer 166 comprises the active area 401 and the EBR area 402 of the wafer 166. The CCD camera 301 is arranged to capture the image of the area in the block 403 in which a portion of the active area 401 and a portion of the EBR area 402 are within the block 403. Therefore, the illuminant device 302 is controlled to illuminate at least the area in the block 403 of the wafer 166 when the CCD camera 301 captures the image in the block 403.

Figure 5:
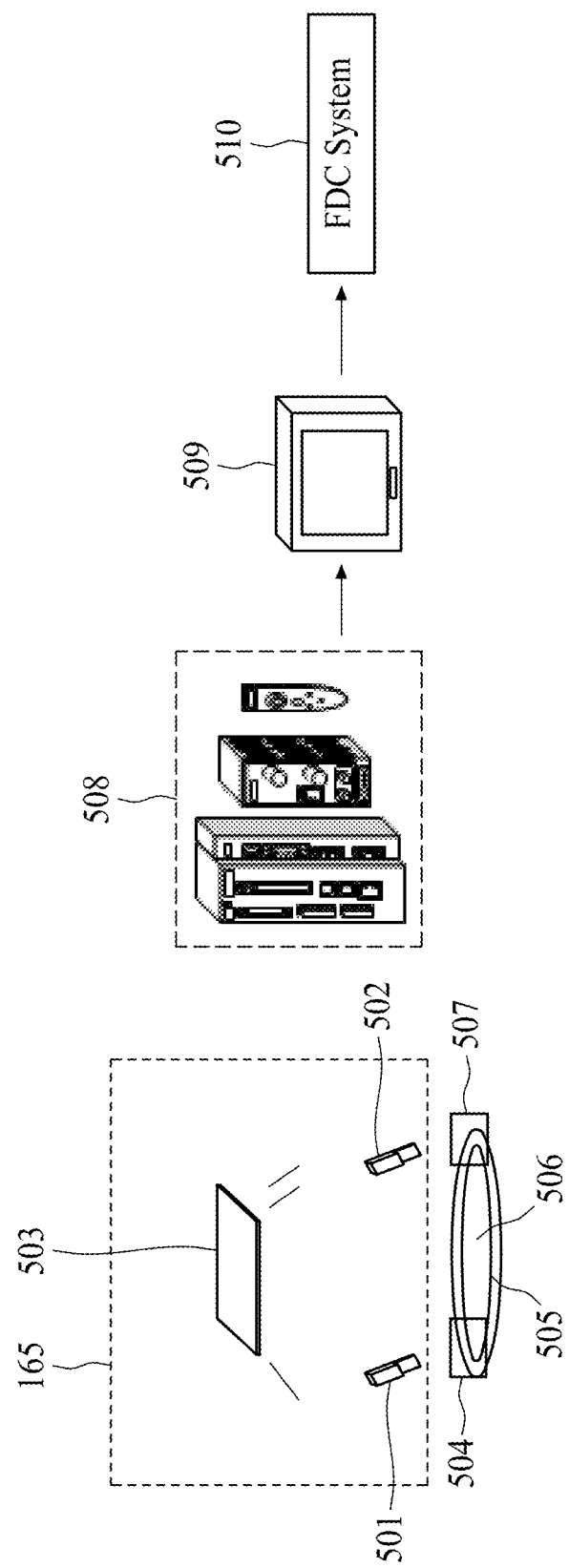
FIG. 5 is a simplified diagram illustrating an edge detector in a semiconductor apparatus in accordance with some embodiments.

In addition, to precisely analyze the EBR area 402 of the wafer 166, more than one portion (e.g. two or more different portions) on the EBR area 402 are monitored. According to the embodiments, the CCD camera 301 comprises a first CCD sensor and a second CCD sensor in order to capture images of a first portion and a second portion on the EBR area 402 respectively. FIG. 5 is a simplified diagram illustrating the edge detector 165 in the semiconductor apparatus 16 in accordance with some embodiments. The edge detector 165 comprises a first CCD sensor 501, a second CCD sensor 502, and an illuminant device 503. The first CCD sensor 501 is arranged to capture an image of a first portion 504 of an EBR area 505 of a wafer 506. The second CCD sensor 502 is arranged to capture an image of a second portion 507 of the EBR area 505 of the wafer 506. The first portion 504 and the second portion 507 are two different portions of the EBR area 505. The first CCD sensor 501 and the second CCD sensor 502 are installed in two different positions above the robot arm (not shown in FIG. 5) for carrying the wafer 506 so as to clearly capture the images of first portion 504 and the second portion 507. It is noted that the EBR area 505 is roughly the area near the outer boundary of the wafer 506.

The illuminant device 503 is installed substantially above in the semiconductor apparatus 16 for the purpose of illuminating the first portion 504 and the second portion 507 of the EBR area 505. More specifically, when the wafer 506 carried by the robot arm (not shown in FIG. 5) reaches the predetermined location, the illuminant device 503 is activated to illuminate the first portion 504 and the second portion 507 such that the first CCD sensor 501 and the second CCD sensor 502 can better capture the images of the first portion 504 and the second portion 507, respectively. In the embodiments, the illuminant device 503 illuminates the first portion 504 and the second portion 507 with a red light. However, this is not a limitation of the embodiments. The illuminant device 503 may illuminate other suitable back light for the first portion 504 and the second portion 507.

In addition, although only one illuminant device 503 is shown in FIG. 5, this is not a limitation of the embodiments. The illuminant device 503 may comprise two separate illuminant devices so as to illuminate the first portion 504 and the second portion 507 of the EBR area 505, respectively. By doing so, the first CCD sensor 501 and the second CCD sensor 502 are more capable of capturing the images of the first portion 504 and the second portion 507, respectively.

According to the embodiments, the first portion 504 and the second portion 507 are symmetrically located on the EBR area 506. For example, when the first portion 504 is located on the rightmost area of the EBR area 506, the second portion 507 may be located on the leftmost area of the EBR area 506. However, this is not a limitation of the embodiments. The first portion 504 and the second portion 507 may be any two different portions on the EBR area 505 as long as the EBR area 505 of the wafer 506 can be successful inspected and analyzed by the above-mentioned processing device according to the captured images.

In FIG. 5, a controlling device 508 is also shown. The controlling device 508 is arranged to control the operation of the first CCD sensor 501, the second CCD sensor 502, and the illuminant device 503. The controlling device 508 may be installed in a semiconductor apparatus (i.e. the semiconductor apparatus 16) or incorporated with the above-mentioned controlling device 128. Alternatively, the controlling device 508 may be externally set up to provide control signals to an electroplating system (i.e. the electroplating system 100).

When the images of the first portion 504 and the second portion 507 of the EBR area 505 are captured by the first CCD sensor 501 and the second CCD sensor 502, respectively, the image data is transmitted to a personal computer (PC) 509 in order to measure the widths of the EBR area 505 in the first portion 504 and the second portion 507 of the wafer 506. The PC 509 may comprise a monitor or a screen in order to display, in real time, the images captured by the first CCD sensor 501 and the second CCD sensor 502 together with the measured widths of the EBR area 505. The measured widths are then transmitted to a fault detection and classification (FDC) system 510 in order to determine if any abnormal etching edge occurs in the EBR area 505. The PC 509 may transmit data in the form of SECS-II code to the FDC system 510.

The FDC system 510 is a computer integrated manufacturing (CIM) FDC system capable of automatically detecting and classifying the errors found in the EBR area 505. When an error is found in the EBR area 505, the FDC system 510 may send an alarm signal to alert the manufacturer. Therefore, the embodiments in FIG. 5 can monitor, in real time, the EBR area 505 of the wafer 506 in the semiconductor apparatus 16. Moreover, the FDC system 510 may collect the width of the EBR area of each wafer processed by the electroplating apparatus (i.e. the electroplating apparatus 14) so as to evaluate or track the performance of the electroplating system (i.e. the electroplating system 100).

In an embodiment, the images of the first portion 504 and the second portion 507 of the EBR area 505 captured by the first CCD sensor 501 and the second CCD sensor 502 are in relatively high digital resolution, and thus the width of the EBR area 505 can be precisely determined. For example, the first CCD sensor 501 and the second CCD sensor 502 capture a full-color image of the first portion 504 and the second portion 507 in order to generate the image data. In that case, the first CCD sensor 501 and the second CCD sensor 502 are configured to not only sense the grayscale information of the first portion 504 and the second portion 507.

In some embodiments, the PC 509 and the FDC system 510 may be externally set up. However, this is not a limitation of the embodiments. In other embodiments, some of the components of the PC 509 and the FDC system 510 may be installed in the semiconductor apparatus (i.e. the semiconductor apparatus 16) or incorporated with the above-mentioned controlling device 128.

Figure 6:
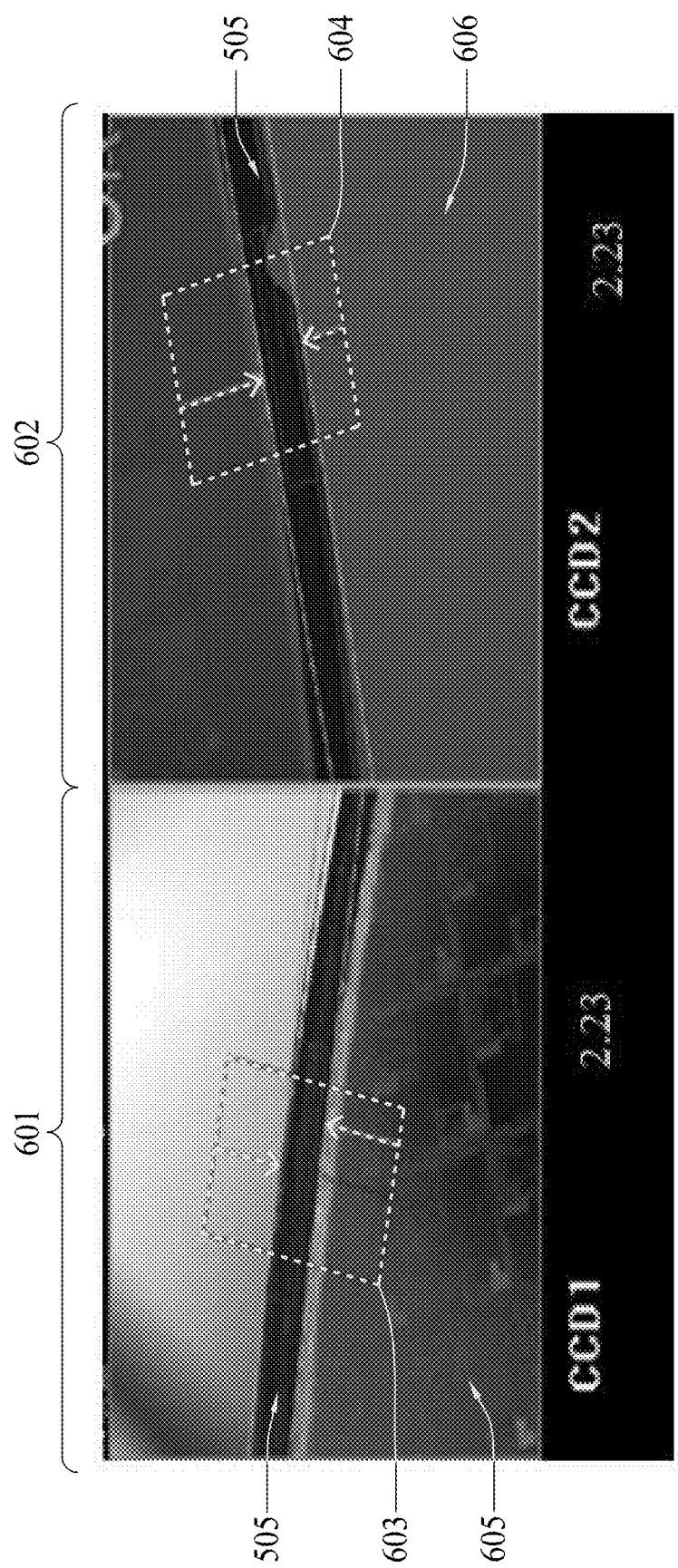
FIG. 6 is a real picture illustrating a first image and a second image of an EBR area in accordance with some embodiments.

FIG. 6 is a real picture illustrating a first image 601 and a second image 602 of an EBR area in accordance with some embodiments. The first image 601 and the second image 602 are the real-time images of the wafer 506 captured by the first CCD sensor 501 (i.e. CCD1) and the second CCD sensor 502 (i.e. CCD2), respectively. The first image 601 and the second image 602 are displayed on the monitor of the PC 509. The first image 601 shows the first portion 504 of the EBR area 505 while the second image 602 shows the second portion 507 of the EBR area 505. Moreover, the first image 601 shows the measured position 603 and a measured width of approximately 2.23 mm of the EBR area 505 in the first portion 504. The second image 602 shows the measured position 604 and a measured width of approximately 2.23 mm of the EBR area 505 in the second portion 507. The PC 509 comprises a processing device used to automatically detect and measure the widths of the EBR area 505 in the first portion 504 and the second portion 507. It is noted that the numerals 605 and 606 in the first image 601 and the second image 602 represent the useable areas (or active areas) of the wafer 506.

Figure 7:
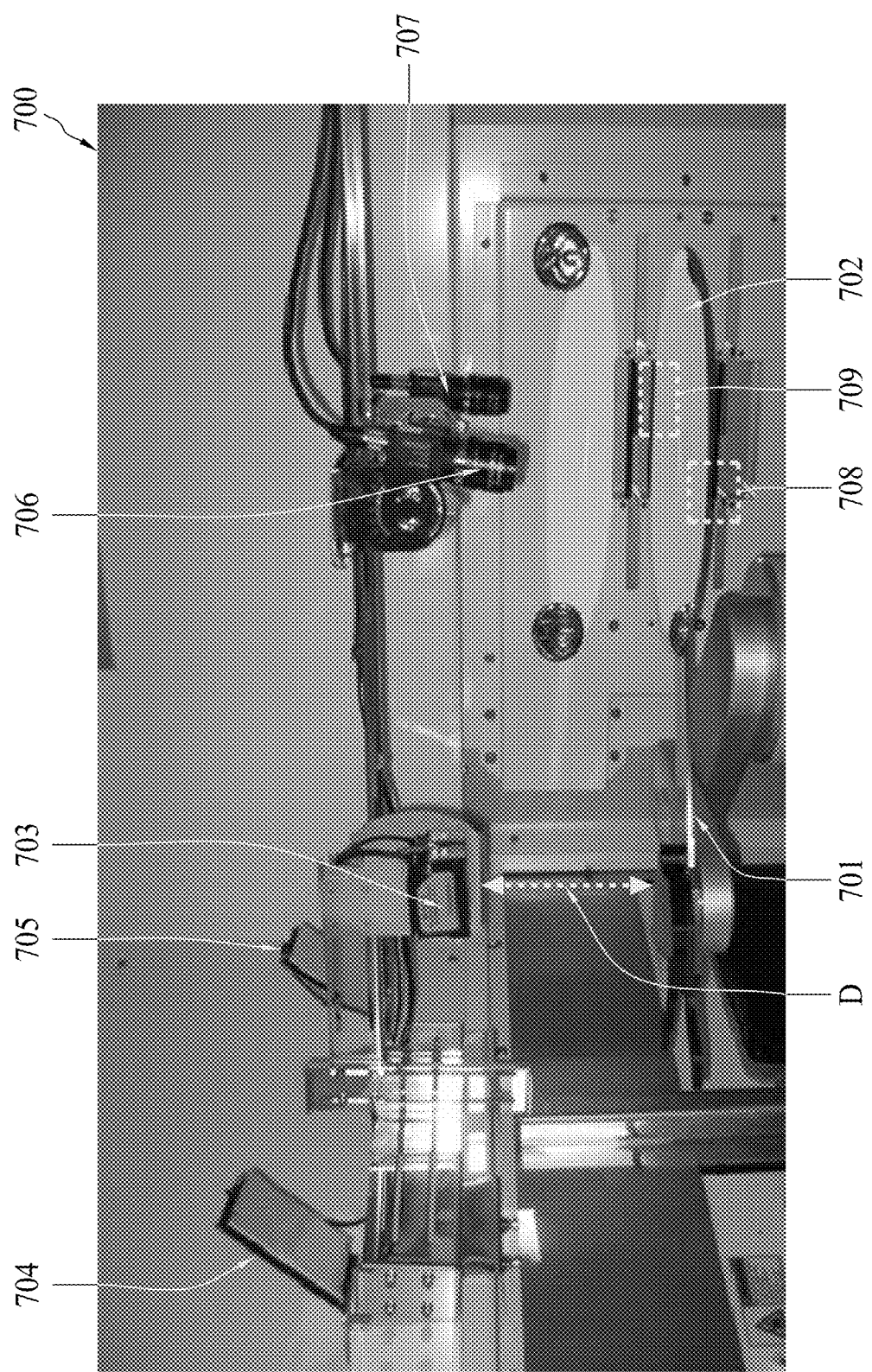
FIG. 7 is a real picture illustrating a semiconductor apparatus in accordance with some embodiments.

FIG. 7 is a real picture illustrating a semiconductor apparatus 700 in accordance with some embodiments. The semiconductor apparatus 700 comprises a robot arm 701, a wafer 702, a trigger device 703, a first illuminant device 704, a second illuminant device 705, a first CCD sensor 706, and a second CCD sensor 707. It is noted that the robot arm 701, the wafer 702, the first and second illuminant devices 704, 705, the first CCD sensor 706, and the second CCD sensor 707 are similar to the above-mentioned robot arm 163, the wafer 166, the illuminant device 503, the first CCD sensor 501, and the second CCD sensor 502, respectively, thus the detailed description is omitted here for brevity. In comparison with the embodiments in FIG. 5, the semiconductor apparatus 700 further comprises the trigger device 703. The trigger device 703 is arranged to activate the first CCD sensor 706 and the second CCD sensor 707 so as to capture the images of a first portion 708 and a second portion 709 on the wafer 702 when the trigger device 703 determines that a distance D between the trigger device 703 and the robot arm 701 reaches a predetermined distance Dp. Moreover, when the trigger device 703 determines that the distance D between the trigger device 703 and the robot arm 701 is substantially equal to the predetermined distance Dp, the trigger device 703 also activates the first illuminant device 704 and the second illuminant device 705 in order to illuminate the first portion 708 and the second portion 709 such that the first CCD sensor 706 and the second CCD sensor 707 can clearly capture the images of the first portion 708 and the second portion 709, respectively. The trigger device 703 is configured to use a laser beam to determine the distance D between the trigger device 703 and the robot arm 701. However, this is not a limitation of the embodiments.

According to the embodiments, when the robot arm 701 carries the wafer 702 to the annealing station (not shown in FIG. 7) from the aligner (not shown in FIG. 7), and when the wafer 702 reaches the predetermined position where the first CCD sensor 706 and the second CCD sensor 707 can clearly capture the images of the first portion 708 and the second portion 709, respectively, the distance D between the trigger device 703 and the robot arm 701 is the predetermined distance Dp. For example, the predetermined position may be a position where the first portion 708 and the second portion 709 are right below the first CCD sensor 706 and the second CCD sensor 707, respectively. Therefore, once the trigger device 703 detects that the distance D is the predetermined distance Dp, the trigger device 703 activates the first illuminant device 704, the second illuminant device 705, the first CCD sensor 706, and the second CCD sensor 707. It is noted that the first illuminant device 704 and the second illuminant device 705 may be activated slightly earlier than the first CCD sensor 706 and the second CCD sensor 707. After the first CCD sensor 706 and the second CCD sensor 707 capture the images of the first portion 708 and the second portion 709, respectively, the first illuminant device 704 and the second illuminant device 705 may be turned off until the next wafer reaches the predetermined position.

In some embodiments, the transferring route (e.g. the dotted line arrow 207 in FIG. 2) of the wafer 702 delivered from the aligner to the annealing station is the predetermined route set by the manufacturer of the semiconductor apparatus 700. Moreover, the first CCD sensor 706 and the second CCD sensor 707 are installed above the predetermined route so as to capture the images of the first portion 708 and the second portion 709, respectively, when the wafer 702 passes a predetermined position on the predetermined route. Therefore, the operation of capturing the images of the first portion 708 and the second portion 709 does not delay the preset speed of the robot arm 701, and the present embodiments do not impact the wafer throughput of the electroplating system.

Figure 8:
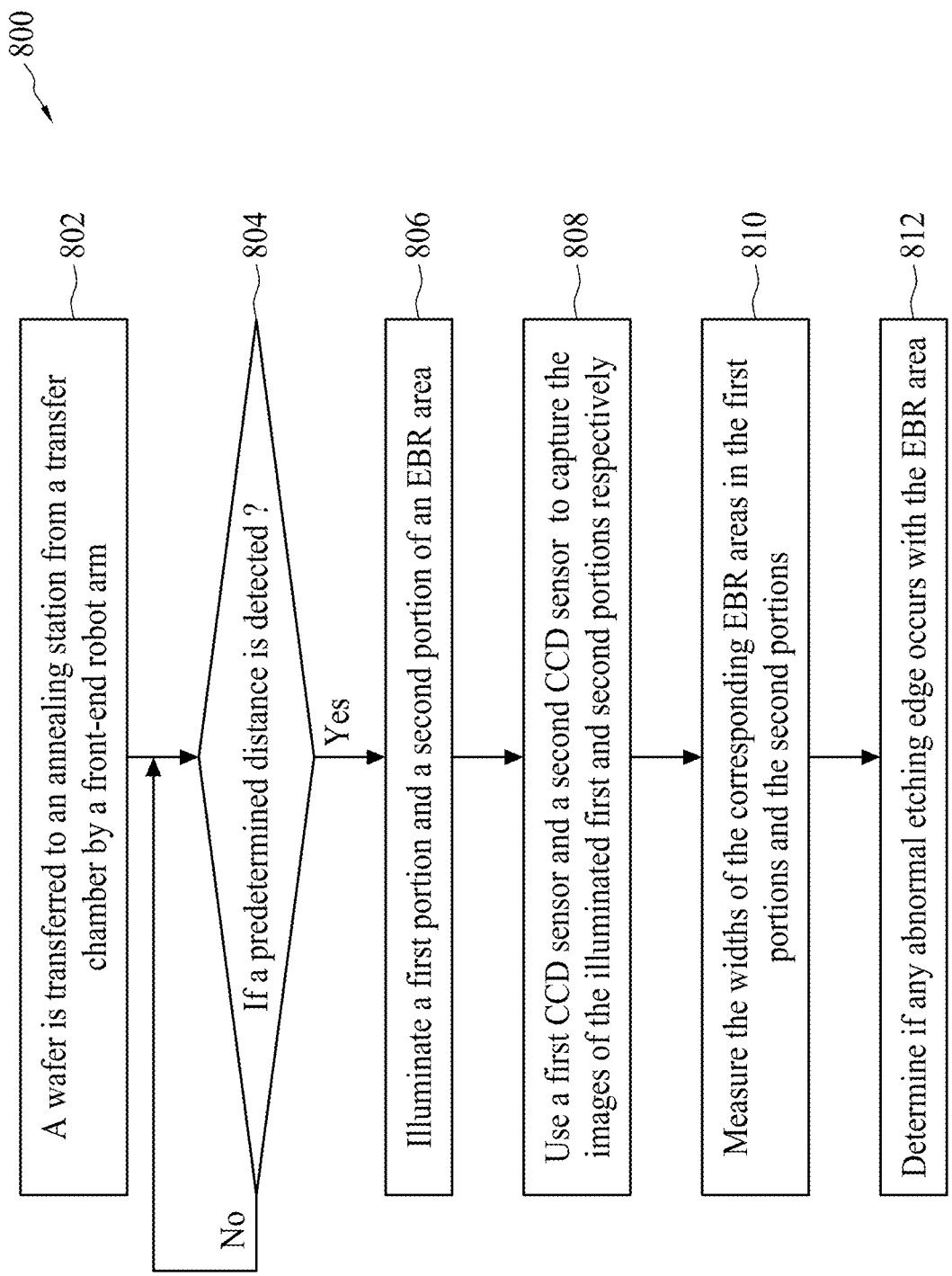
FIG. 8 is a flow diagram illustrating a method for inspecting a wafer in accordance with some embodiments.

FIG. 8 is a flow diagram illustrating a method 800 for inspecting a wafer in accordance with some embodiments. Referring to FIG. 8, in operation 802, a wafer is transferred to an annealing station from a transfer chamber by a front-end robot arm.

In operation 804, a distance between a trigger device and the front-end robot arm is detected. If the distance is a predetermined distance, meaning that the wafer reaches a predetermined location, then the method 800 goes to operation 806. If the distance is not the predetermined distance, meaning that the wafer does not reach the predetermined location, then the method 800 goes back to operation 804.

In operation 806, a first illuminant device and a second illuminant device are activated to illuminate a first portion and a second portion of an EBR area of the wafer respectively.

In operation 808, a first CCD sensor and a second CCD sensor are activated to capture the images of the illuminated first and second portions.

In operation 810, the images of the first portions and the second portions together with the measured widths of the corresponding EBR areas are displayed on a PC in real time.

In operation 812, the measured widths corresponding to the wafer are transmitted to an FDC system to determine if any abnormal etching edge occurs in the EBR area. The operation of method 800 can be referred to the operation of the embodiments as shown in FIG. 1, FIG. 2, FIG. 5, and/or FIG. 7, wherein the detailed description of the method 800 is omitted here for brevity.

Briefly, according to the embodiments, the edge detector is installed above a robot arm in the semiconductor apparatus in order to capture the images of the EBR area when the robot arm transfers the wafer to the annealing station from the transfer station. Thus, the edge detector does not impact the wafer throughput of the electroplating system. In addition, the edge detector uses a CCD camera(s) to capture the images of the EBR area illuminated by an illuminant device. The captured images are processed and analyzed by a computer to detect, in real-time, the abnormal width of the EBR area. Moreover, when the EBR area is captured by the CCD camera, the captured image can be in high digital resolution, and thus the width of the EBR area can be precisely determined to reduce the false alarm rate.

In some embodiments, a semiconductor apparatus includes a transfer chamber, an annealing station, a robot arm, and an edge detector. The transfer chamber is configured to interface with an electroplating apparatus. The annealing station is arranged to anneal a wafer. The robot arm is arranged to transfer the wafer from the transfer chamber to the annealing station. The edge detector is disposed over the robot arm for the purpose of monitoring at least one portion of an edge bevel removal area of the wafer carried by the robot arm.

In some embodiments, a method for inspecting a wafer includes: transferring the wafer from a transfer chamber to an annealing station by a robot arm; and monitoring at least one portion of an edge bevel removal area of the wafer over the robot arm when the wafer is transferred from the transfer chamber to the annealing station.

In some embodiments, an electroplating system includes an electroplating apparatus and a semiconductor apparatus. The electroplating apparatus is arranged to electroplate a wafer. The semiconductor apparatus includes a transfer chamber, an annealing station, a robot arm, and an edge detector. The transfer chamber is arranged to interface with the electroplating apparatus. The annealing station is arranged to anneal the wafer. The robot arm is arranged to transfer the wafer from the transfer chamber to the annealing station. The edge detector is disposed over the robot arm for the purpose of monitoring at least one portion of an edge bevel removal area of the wafer carried by the robot arm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for inspecting a wafer, the method comprising:
    transferring the wafer from a transfer chamber to an annealing station by a robot arm; and
    monitoring at least one portion of an edge bevel removal area of the wafer over the robot arm when the wafer is transferred from the transfer chamber to the annealing station;
    wherein the at least one portion of the edge bevel removal area comprises a first portion and a second portion different from the first portion; monitoring the at least one portion of the edge bevel removal area comprises:
    when the wafer is passing through a predetermined location between the transfer chamber and the annealing station, using a first charge-coupled device (CCD) sensor located over the first portion of the edge bevel removal area to capture an image of the first portion, and using a second CCD sensor located over the second portion of the edge bevel removal area to capture an image of the second portion.

2. The method of claim 1, further comprising:
    illuminating the at least one portion of the edge bevel removal area.

3. The method of claim 2, wherein the at least one portion of the edge bevel removal area is illuminated when the wafer is passing through the predetermined location between the transfer chamber and the annealing station.

4. The method of claim 2, wherein illuminating the at least one portion of the edge bevel removal area comprises:
    when the wafer is passing through the predetermined location between the transfer chamber and the annealing station, using a first illuminant device to illuminate the first portion of the edge bevel removal area, and using a second illuminant device to illuminate the second portion of the edge bevel removal area.

5. The method of claim 2, further comprising:
    after the first CCD sensor and the second CCD sensor capture the image of the first portion and the image of the second portion, respectively, stopping illuminating the at least one portion of the edge bevel removal area.

6. The method of claim 1, wherein monitoring the at least one portion of the edge bevel removal area further comprises:
    analyzing the image of the first portion of the edge bevel removal area to measure a width of the first portion of the edge bevel removal area;
    analyzing the image of the second portion of the edge bevel removal area to measure a width of the second portion of the edge bevel removal area; and
    inspecting the wafer according to the measured width of the first portion of the edge bevel removal area and the measured width of the second portion of the edge bevel removal area.

7. The method of claim 1, wherein monitoring the at least one portion of the edge bevel removal area further comprises:
    detecting if a distance between the robot arm and a trigger device equals to a predetermined distance; and
    when it is detected that the distance between the robot arm and the trigger device equals to the predetermined distance, determining that the wafer is passing through the predetermined location, and utilizing the trigger device to activate the first CCD sensor and the second CCD sensor to capture the image of the first portion and the image of the second portion, respectively.

8. The method of claim 7, wherein when the robot arm holds the wafer and is in motion, a first moving part of the robot arm is covered by the wafer while a second moving part of the robot arm is left exposed; the distance between the trigger device and the robot arm detected by the trigger device is a distance between the trigger device and the second moving part of the robot arm.

9. The method of claim 1, wherein the first portion and the second portion of the edge bevel removal area are right below the first CCD sensor and the second CCD sensor, respectively.

10. The method of claim 1, wherein the first portion and the second portion are symmetrically located on the edge bevel removal area.

11. A method for inspecting a wafer, the method comprising:
- transferring the wafer from a transfer chamber to an annealing station by a robot arm;
- determining if a first portion and a second portion of an edge bevel removal area of the wafer transferred by the robot arm are passing through a first location and a second location between the transfer chamber and the annealing station, respectively, wherein the first portion is different from the second portion, and the first location is different from the second location; and
- when it is determined that the first portion and the second portion of the edge bevel removal area are passing through the first location and the second location between the transfer chamber and the annealing station, respectively, using a first charge-coupled device (CCD) sensor located over the first portion of the edge bevel removal area to capture an image of the first portion, and using a second CCD sensor located over the second portion of the edge bevel removal area to capture an image of the second portion.

12. The method of claim 11, wherein determining if the first portion and the second portion of the edge bevel removal area are passing through the first location and the second location between the transfer chamber and the annealing station respectively comprises:
- detecting if a distance between the robot arm and a trigger device equals to a predetermined distance; and
- when it is detected that the distance between the robot arm and the trigger device equals to the predetermined distance, determining that the first portion and the second portion of the edge bevel removal area are passing through the first location and the second location between the transfer chamber and the annealing station respectively.

13. The method of claim 11, wherein the first portion and the second portion of the edge bevel removal area are right below the first CCD sensor and the second CCD sensor, respectively.

14. The method of claim 11, further comprising:
- analyzing the image of the first portion of the edge bevel removal area to measure a width of the first portion of the edge bevel removal area;
- analyzing the image of the second portion of the edge bevel removal area to measure a width of the second portion of the edge bevel removal area; and
- inspecting the wafer according to the measured width of the first portion of the edge bevel removal area and the measured width of the second portion of the edge bevel removal area.

15. The method of claim 11, further comprising:
- when it is determined that the first portion and the second portion of the edge bevel removal area are passing through the first location and the second location between the transfer chamber and the annealing station, respectively, illuminating the first portion and the second portion of the edge bevel removal area.

16. The method of claim 15, further comprising:
- after the first CCD sensor and the second CCD sensor capture the image of the first portion and the image of the second portion, respectively, stopping illuminating the first portion and the second portion of the edge bevel removal area.

17. A method for inspecting a wafer, the method comprising:
- transferring the wafer from a transfer chamber to an annealing station by a robot arm; and
- when the wafer is passing through a predetermined location between the transfer chamber and the annealing station, activating N charge-coupled device (CCD) sensors located over N different portions of an edge bevel removal area of the wafer concurrently, N being a positive integer greater than one; and
- utilizing the N CCD sensors to capture images of the N different portions of the edge bevel removal area of the wafer, respectively.

18. The method of claim 17, further comprising:
- when the wafer is passing through the predetermined location between the transfer chamber and the annealing station, turning on N illumination devices to illuminate the N different portions of the edge bevel removal area, respectively.

19. The method of claim 18, further comprising:
- after the N CCD sensors capture the images of the N different portions of the edge bevel removal area of the wafer respectively, turning off the N illumination devices.

20. The method of claim 17, wherein the N different portions of the edge bevel removal area are right below the N CCD sensors, respectively.

* * * * *